(12) United States Patent
Yang et al.

(10) Patent No.: US 7,951,647 B2
(45) Date of Patent: May 31, 2011

(54) PERFORMING DIE-TO-WAFER STACKING BY FILLING GAPS BETWEEN DIES

(75) Inventors: Ku-Feng Yang, Dali (TW); Wen-Chih Chiou, Miaoli (TW); Weng-Jin Wu, Hsin-Chu (TW); Ming-Chung Sung, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 367 days.

(21) Appl. No.: 12/140,695

(22) Filed: Jun. 17, 2008

(65) Prior Publication Data

US 2009/0311829 A1    Dec. 17, 2009

(51) Int. Cl.
    *H01L 21/76*    (2006.01)
(52) U.S. Cl. .................. 438/109; 438/108; 257/E21.001
(58) Field of Classification Search .................... 438/108
    See application file for complete search history.

(56) References Cited

U.S. PATENT DOCUMENTS

| 7,098,544 | B2 | 8/2006 | Edelstein et al. | |
| 7,154,185 | B2 | 12/2006 | Lee et al. | |
| 2005/0112795 | A1 | 5/2005 | Lee et al. | |
| 2005/0145994 | A1 | 7/2005 | Edelstein et al. | |
| 2007/0044296 | A1* | 3/2007 | Jeon et al. | 29/594 |
| 2008/0012148 | A1* | 1/2008 | Takahashi | 257/778 |

FOREIGN PATENT DOCUMENTS

CN    1627490 A    6/2005
CN    1926681 A    3/2007

OTHER PUBLICATIONS

Klumpp, A., et al., "3D System Integration," VLSI Technology, Systems and Applications, Apr. 23-25, 2007, 2 pages, IEEE.

* cited by examiner

*Primary Examiner* — Andy Huynh
*Assistant Examiner* — Valerie Brown
(74) *Attorney, Agent, or Firm* — Slater & Matsil, L.L.P.

(57) ABSTRACT

An integrated circuit structure includes a bottom semiconductor chip; a top die bonded onto the bottom semiconductor chip; a protecting material encircling the bottom die and on the bottom semiconductor chip; and a planar dielectric layer over the top die and the protecting material. The protecting material has a top surface leveled with a top surface of the top die.

20 Claims, 6 Drawing Sheets

PERFORMING DIE-TO-WAFER STACKING BY FILLING GAPS BETWEEN DIES

TECHNICAL FIELD

This invention relates generally to integrated circuits, and more particularly to die-to-wafer bonding methods.

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and the length of interconnections between devices as the number of devices increases. When the number and length of interconnections increase, both circuit RC delay and power consumption increase. Three-dimensional (3D) integrated circuits (ICs) are therefore created to resolve the above-discussed limitations. In a typical formation process of 3D IC, two wafers, each including a plurality of semiconductor chips having integrated circuits, are formed. The wafers are then bonded together. Deep vias are then formed to interconnect the integrated circuits in the two wafers.

Conventional methods for forming 3D IC also include die-to-wafer bonding, wherein a plurality of dies is bonded to a wafer. An advantageous feature of the die-to-wafer bonding is that the size of dies may be smaller than the size of chips on the wafer. During a typical die-to-wafer bonding process, spacings will be left between the dies. FIGS. 1 and 2 illustrate cross-sectional views of intermediate stages in a conventional die-to-wafer bonding process. Referring to FIG. 1, dies 100 are stacked on wafer 102, which include semiconductor chips 104. Semiconductor chips 104 are larger than dies 100, and leave spacings 106 between dies 100. During subsequent process steps, as shown in FIG. 2, dies 100 are thinned, for example, to a thickness of about 30 µm, so that through-silicon vias (TSV) 110, which are in dies 100, are exposed. Bond pads (not shown) may then be formed on the surfaces of dies 100 and connected to TSV 110.

The above-discussed die-to-wafer bonding process suffers from drawbacks. During the thinning of dies 100, undesirable substances, such as moisture, particles generated during the thinning, and detrimental chemicals, may fall into spacing 106, and may degrade the performance of semiconductor chips 104. Currently, there are no effective methods for removing the undesirable substances. Further, the existing structure as shown in FIG. 2 has limited number of input/outputs. This is partially because TSV 100 (or other possible conductive feature connected to the subsequently formed bond pads) needs to have pitches great enough to accommodate the bond pads. Further, it is difficult to form metallization layers on dies 100. The equipments for forming dielectric layers, for example, the equipments for chemical vapor deposition, will reject to form films on the surface of the structure shown in FIG. 2, whose top surface is considered to be too rough by the equipments. Therefore, the number of inputs/outputs of the stacked-die structure has been limited to the existing inputs/outputs in dies 100. New die-to-wafer stacking methods are thus needed to solve the above-discussed problems.

SUMMARY OF THE INVENTION

In accordance with one aspect of the present invention, an integrated circuit structure includes a bottom semiconductor chip; a top die bonded onto the bottom semiconductor chip; a protecting material encircling the bottom die and on the bottom semiconductor chip; and a planar dielectric layer over the top die and the protecting material. The protecting material has a top surface leveled with a top surface of the top die.

In accordance with another aspect of the present invention, an integrated circuit structure includes a bottom wafer including a plurality of bottom semiconductor chips; a plurality of top dies, each bonded onto one of the plurality of bottom semiconductor chips; a protecting material filling spacings between the plurality of top dies; an enclosure ring on, and close to an outer parameter of, the bottom wafer, wherein a top surface of the protecting material, top surfaces of the top dies, and a top surface of the enclosure ring are leveled; a planar dielectric layer on the plurality of top dies and the protecting material, wherein the planar dielectric layer extends over substantially all of the plurality of the top dies and the protecting material; and a conductive feature in the planar dielectric layer. The conductive feature is electrically connected to at least one of the plurality of top dies and the plurality of the bottom semiconductor chips.

In accordance with yet another aspect of the present invention, an integrated circuit structure includes a bottom wafer comprising a plurality of bottom semiconductor chips; a plurality of top dies, each bonded to one of the plurality of bottom semiconductor chips; a protecting material filling spacings between the plurality of top dies; an enclosure ring on, and close to an outer parameter of, the bottom wafer, wherein a top surface of the protecting material, top surfaces of the top dies, and a top surface of the enclosure ring are substantially leveled; a planar dielectric layer on the plurality of top dies and the protecting material, wherein the planar dielectric layer extends over substantially an entirety of the bottom wafer; and a copper line in the planar dielectric layer, wherein the copper line is electrically connected to at least one of the plurality of top dies and the plurality of the bottom semiconductor chips, and has a top surface leveled with a top surface of the planar dielectric layer.

In accordance with yet another aspect of the present invention, a method of forming an integrated circuit structure includes providing a bottom wafer including a plurality of bottom semiconductor chips; providing a plurality of top dies, each bonded to one of the plurality of bottom semiconductor chips; forming an enclosure ring on, and close to an outer parameter of, the bottom wafer; applying a protecting material filling spacings between the plurality of top dies, wherein a top surface of the protecting material, top surfaces of the top dies, and a top surface of the enclosure ring are leveled; forming a planar dielectric layer on the plurality of top dies and the protecting material; and forming a conductive feature in the planar dielectric layer. The conductive feature is electrically connected to at least one of the plurality of top dies and the plurality of the bottom semiconductor chips, and has a top surface leveled with a top surface of the planar dielectric layer.

In accordance with yet another aspect of the present invention, a method of forming an integrated circuit structure includes providing a bottom wafer including a plurality of bottom semiconductor chips; bonding a plurality of top dies, each onto one of the plurality of bottom semiconductor chips; forming an enclosure ring on, and close to an outer parameter of, the bottom wafer; applying a protecting material filling spacings between the plurality of top dies, wherein the protecting material is enclosed by the enclosure ring; solidifying the protecting material; polishing to planarize the protecting material, the plurality of top dies, and the enclosure ring; forming a planar dielectric layer on the plurality of top dies, the protecting material, and the enclosure ring; and forming a copper line in the planar dielectric layer. The copper line is electrically connected to at least one of the plurality of top dies and the plurality of bottom semiconductor chips, and has a top surface leveled with a top surface of the planar dielectric layer.

The advantageous features of the present invention include reduced resistance, reduced manufacturing cost, and improved reliability.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of a novel method for stacking dies onto wafers are illustrated in FIGS. 3 through 9. The variations of the preferred embodiments are also discussed. Throughout the various views and illustrative embodiments of the present invention, like reference numbers are used to designate like elements.

Figure 1:
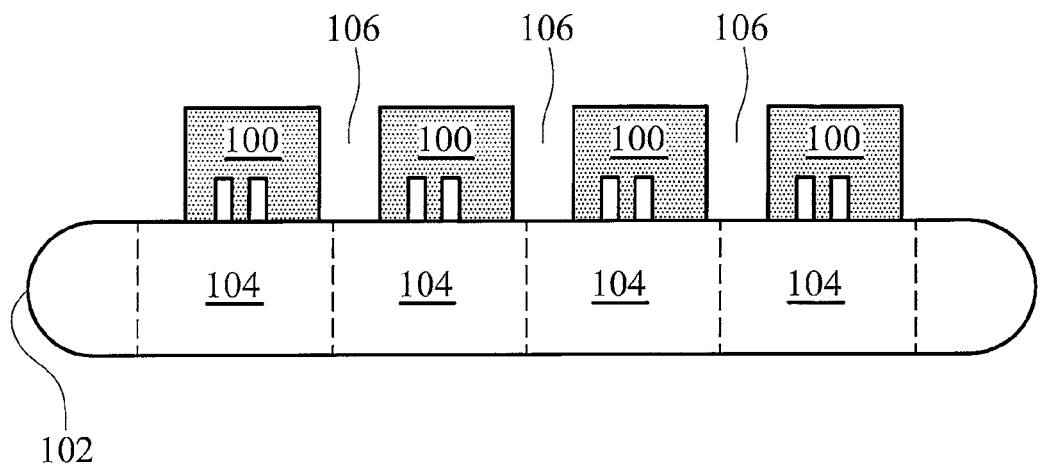
FIGS. 1 and 2 illustrate cross-sectional views of intermediate stages in a conventional die-to-wafer bonding process.
Figure 2:
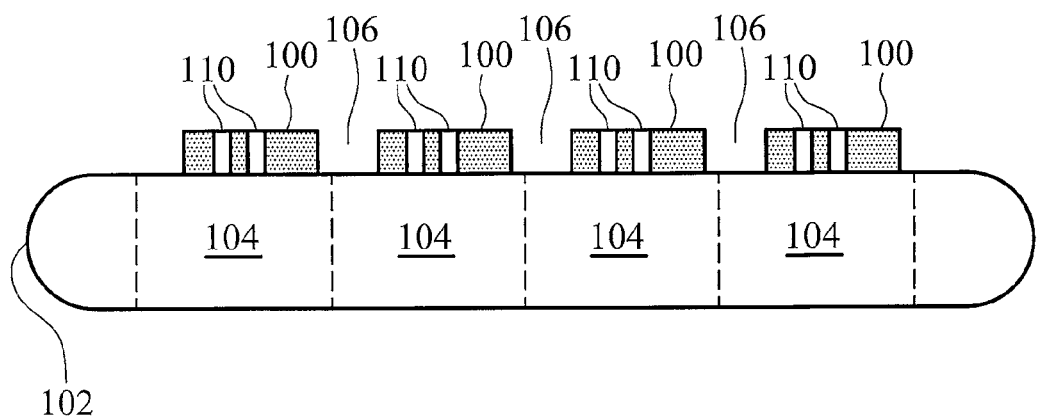
Figure 3:
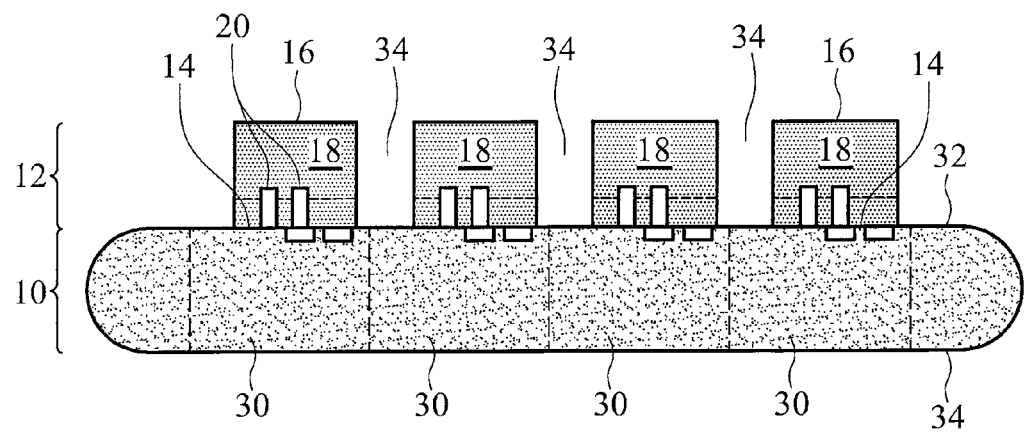
FIGS. 3 through 9 are cross-sectional views of intermediate stages in the manufacturing of an embodiment of the present invention.

Referring to FIG. 3, dies 12 are bonded onto wafer 10. Dies 12 each has front surface 14 and back surface 16. Each of the dies 12 includes semiconductor substrate 18, wherein the back surfaces 16 of dies 12 are also the back surfaces of the respective semiconductor substrates 18. In an embodiment, dies 12 include through-silicon vias (TSV) 20 extend from the front surface 14 up into semiconductor substrate 18, wherein TSVs 20 are connected to semiconductor chips 30. In an alternative embodiment, instead of being pre-formed in dies 12, TSVs 20 are formed after the thinning of dies 12, as will be discussed in detail in subsequent paragraphs.

Wafer 10 includes a plurality of semiconductor chips 30. In an embodiment, each die 12 is bonded onto one semiconductor chip 30. Alternatively, one semiconductor chip 30 may have more than one die 12 bonded thereon. In this case, the dies 12 bonded onto a same semiconductor chip 30 may have the same, or different, circuit design, and/or sizes. Throughout the description, dies 12 are referred to as top dies 12, while semiconductor chips 30 are referred to bottom chips 30.

Wafer 10 has front surface 32 and back surface 34, wherein bond pads 14 and/or other interconnect structures are close to the front surface 32, while the back surface 34 is the back surface of a semiconductor substrate. Integrated circuits (not shown) including active and passive devices such as transistors, resistors, capacitors, and like, are formed at the front surface of the semiconductor substrates of top dies 12 and bottom chips 30.

Preferably, top dies 12 and bottom chips 30 are bonded face-to-face, wherein the bonding methods include commonly used methods such as oxide-to-oxide bonding, oxide-to-silicon bonding, copper-to-copper bonding, and the like. Bottom chips 30 are larger than the overlying top dies 12, and hence spacing 34 are left between top dies 12.

Figure 4A:
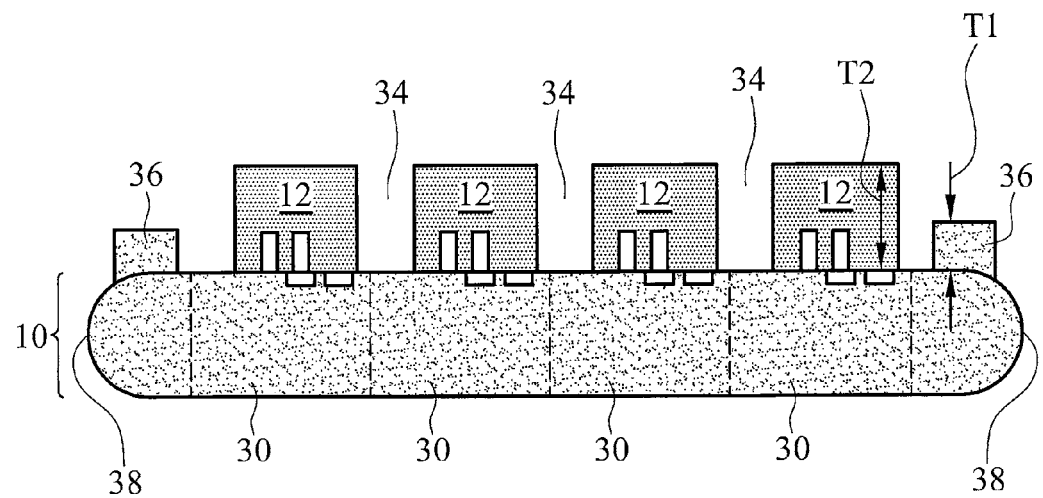
Figure 4B:
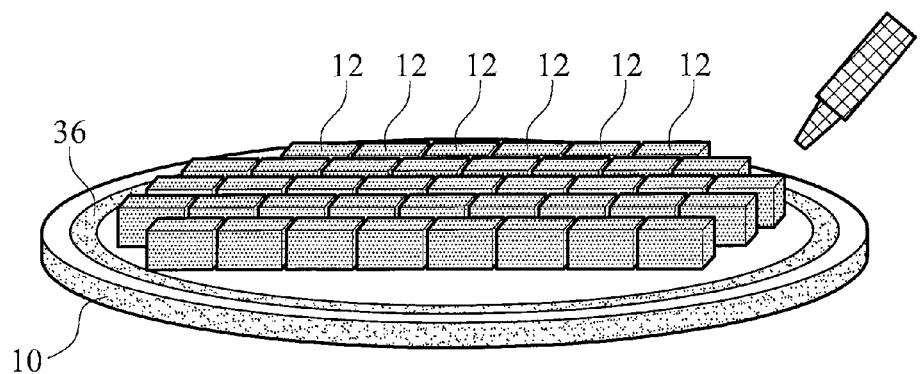

FIG. 4A illustrates the formation of enclosure ring 36. Preferably, enclosure ring 36 encircles dies 12, and is formed close to the outer edge 38 of wafer 10. The outer edge of enclosure ring 36 may be slightly spaced apart from the outer edge 38 of wafer 10 in order to leave a margin. FIG. 4B illustrates a perspective view of the structure shown in FIG. 4A. In an embodiment, enclosure ring 36 is formed by applying a curable material with a high viscosity, such as a polymer, on wafer 10, wherein the application of the polymer is performed when wafer 10 is spinned. In an exemplary embodiment, enclosure ring 36 is formed of polyimide or other high thermal-resist polymer coatings, such as benzocyclobutenes (BCB), Silk™ (Dow chemical), or the like. In alternative embodiments, enclosure ring 36 is formed of a dry film, such as polyimide dry film or dry film ETERTEC HT-100 (Eternal), and may be laminated on wafer 10. In the preferred embodiment, as shown in FIG. 4A, enclosure ring 36 has thickness T1 greater than the thickness T4 of the remaining thickness T4 of top dies 12 after they are thinned (for example, about 30 μm, refer to FIG. 6), but less than the thickness T2 (refer to FIG. 4) of top dies 12 before they are thinned. In alternative embodiments, thickness T1 is substantially equal to thickness T2. In the case enclosure ring 36 is formed of the curable material, a pre-baking is performed to solidify enclosure ring 36.

Figure 5A:
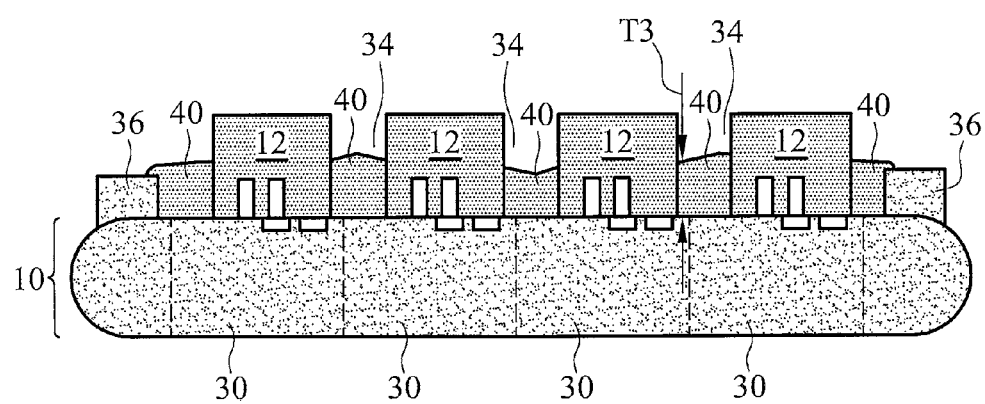
Figure 5B:
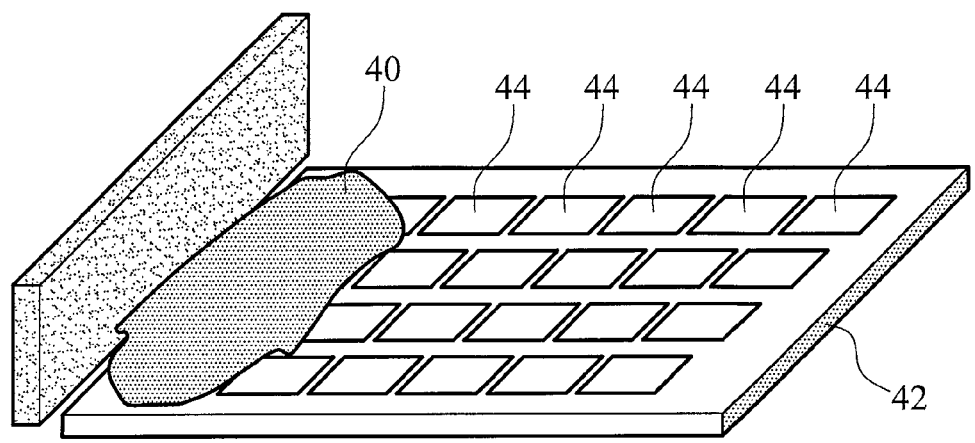
Figure 5C:
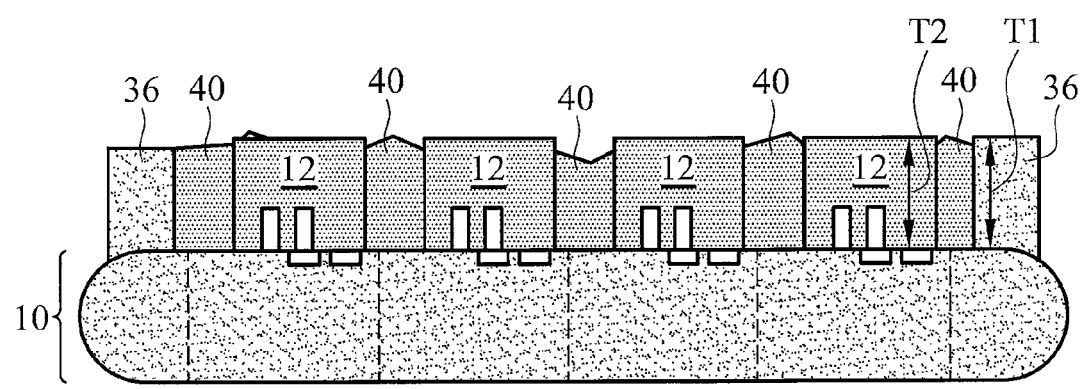

FIG. 5A illustrates the coating of protecting material 40 into spacings 34. In an embodiment, similar to enclosure ring 36, protecting material 40 is formed of a curable material, such as a polymer, and may be formed of a same material as, or a different material from, enclosure ring 36. In an exemplary embodiment, protecting material 40 is formed of polyimide. The thickness T3 of protecting material 40 may be greater than the thickness T4 of the thinned dies 12 (refer to FIG. 6), but less than the thickness T2 of dies 12. Accordingly, as shown in FIG. 5B, protecting material 40 may be coated using screen coating, wherein mask 42 is used to screen dies 12, so that protecting material 40 is not coated onto dies 12 and the portions of wafer 10 outside enclosure ring 36. Mask 42 includes openings 44 corresponding to spacings 34. In alternative embodiments, as shown in FIG. 5C, protecting material 40 is coated into spacings 34 using stencil coating, in which protecting material 40 is blanket coated, and excess protecting material 40 on the top of dies 12 is scraped off. In this case, the thickness T1 of enclosure ring 36 needs to be substantially close to the thickness T2 of dies 12.

Enclosure ring 36 prevents protecting material 40 from being smeared to the level and/or the bottom of wafer 12, which not only adversely affects the subsequent lithograph processes, but also causes more undesirable particles to be generated. After the coating of protecting material 40, a baking is performed to solidify protecting material 40 and to further solidify enclosure ring 36.

Figure 6:
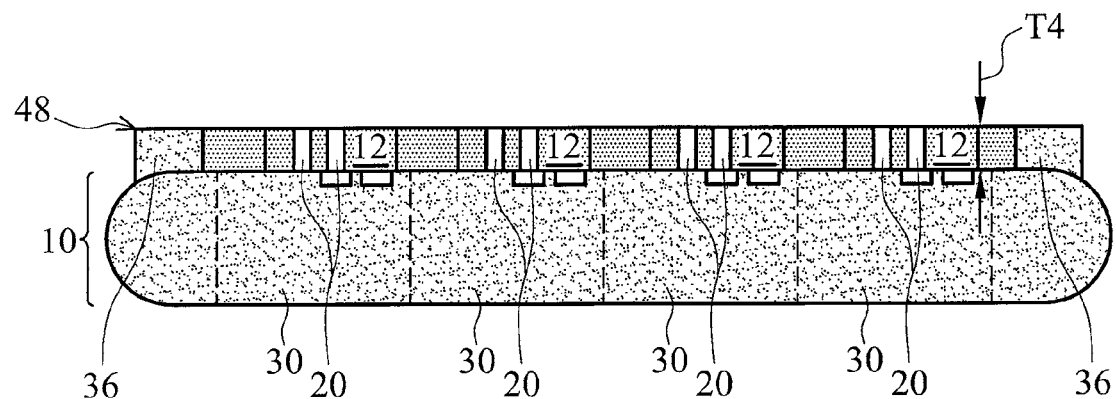

In FIG. 6, top dies 12, protecting material 40, and enclosure ring 36 are polished, for example, using chemical mechanical polish (CMP). The remaining thickness T4 of top dies 12 may be about 30 μm, for example. However, the preferred thickness may be greater or smaller. After the polishing, a flat top surface 48 is formed, wherein TSVs 20, if pre-formed, are exposed through top surface 48.

Figure 7:
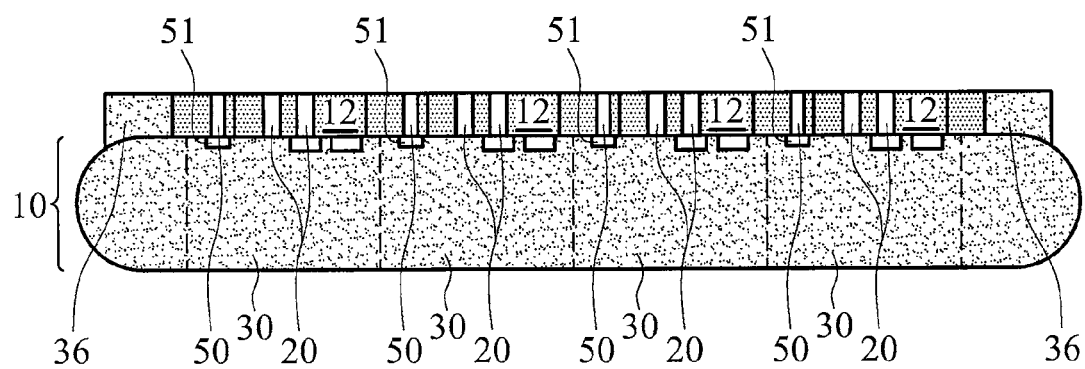

FIG. 7 illustrates the formation of contact plugs 50, and possibly TSV 20, if they were not pre-formed. In the case TSV 20s were not pre-formed, they are formed to connect to the integrated circuit in bottom chips 30, for example, by etching or laser drilling into dies 12 to form openings, and filling the openings with a conductive material such as copper, tungsten, aluminum, silver, or combination of. Barrier layers and insulating layers (not shown) may be formed on the sidewalls of the openings before filling the bulk of the openings. In the case TSV 20 was pre-formed, the formation of TSVs 20 may be omitted. TSV 20 may be connected to top dies 12 and/or bottom chips 30. Since bottom chips 30 are larger than top dies 12, contacts 50 may be formed in protecting material 40 to connect to the integrated circuits (or the interconnect structure such as metal lines, metal pads, or the like) in bottom chips 30. In this case, contacts 50 may be connected to bond pads 51 on the surfaces of bottom chips 30, or penetrate through the passivation layers on the surface of bottom chip 30 to reach the underlying conductive pads.

Figure 8:
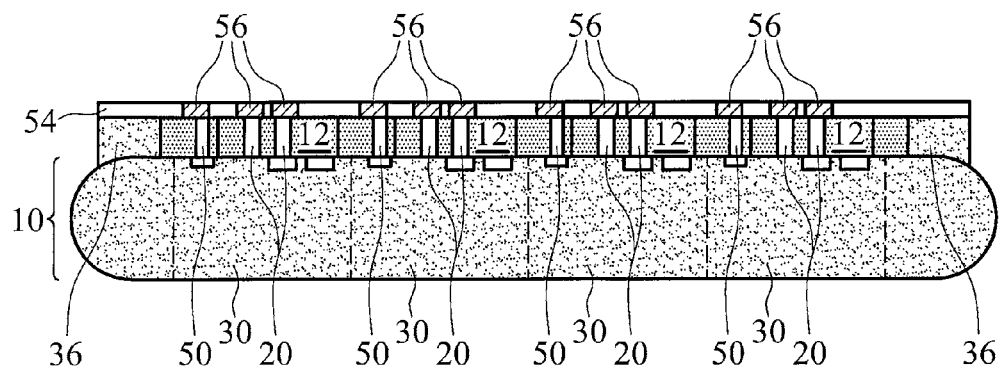

FIG. 8 illustrates the formation of dielectric layer 54 on top dies 12 and protecting material 40. If necessary, an etch stop layer (not shown) may be formed between dielectric layer 54 and top dies 12. Metal lines/pads 56 (referred to as metal lines 56 hereinafter) are formed in dielectric layer 54, and are electrically connected to TSVs 20 and/or contacts 50. Dielectric layer 54 and metal lines 56 may be formed using commonly used methods such as the single damascene process. Alternatively, metal lines 56 are formed by blanket depositing a metal film, patterning the metal film, and filling dielectric layer 54 into the spacing between metal lines 56. Metal lines 56 may be formed of copper, aluminum, tungsten, silver, and combinations thereof. Dielectric layer 54 may be formed of oxides, nitrides, un-doped silicate glass, fluorinated silicate glass, low-k dielectric materials, and the like.

Figure 9:
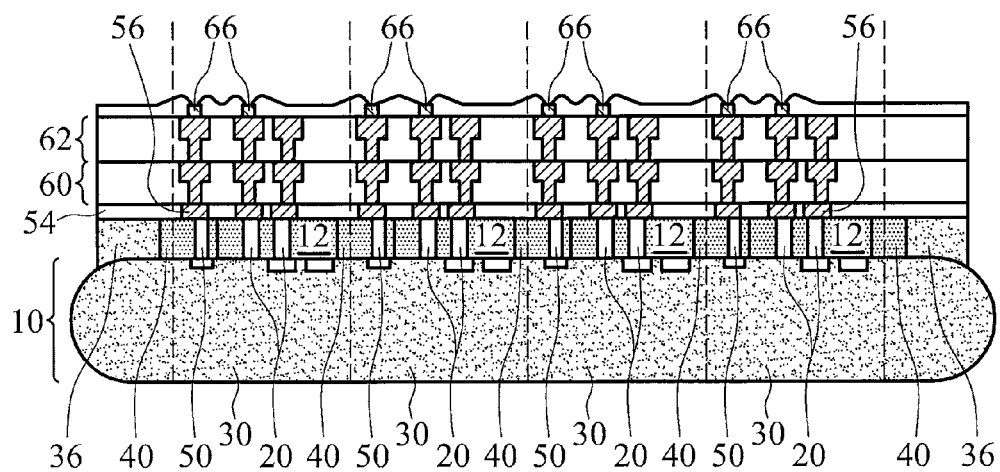

FIG. 9 illustrates the continued formation of more interconnect layers, for example, metallization layers 60 and 62. More layers can be formed if necessary. Each of the metallization layers includes a dielectric layer and conductive features in the dielectric layer, wherein the conductive features (for example, metal lines formed of copper or copper alloys) may be formed of dual damascene processes. The conductive features in metallization layers 60 and 62 are connected to metal lines 56. It is noted that the structure shown in FIG. 8 is similar to a conventional wafer (except conventional wafers do not contained packaged-in dies). Therefore, the methods and structures that are applicable to the manufacturing of interconnect structures on conventional wafers may be used. After the formation of the interconnect layers, bond pads 66 are formed. Next, the stacked dies are sawed along the dotted lines into dies. In the resulting dies, protecting material 40 encircles, and protects the sidewalls of top dies 12, and the outer edges of protecting material 40 will be vertically aligned to the respective outer edges of the bottom chips 30.

The embodiments of the present invention have several advantageous features. By filling protecting material 40 into the spacing between top dies 12 to form a planar surface, the commonly used methods for forming interconnect structures may be used. This significantly expands the flexibility of the design of top dies 12 and bottom chips 30. For example, TSVs with smaller pitches may be formed in top dies 12, wherein the connection of TSVs 20 may be re-routed through the interconnect structures formed on top dies 12 to overlying bond pads 66 (refer to FIG. 9), which may have a greater pitch than that of TSVs 20. Contacts/TSVs may be formed in protecting material 40 to connect to both top dies 12 and/or bottom chips 30. Further, with protecting material 40 filled into the spacings between top dies 12, the possible damage cause by moisture and other detrimental substances to top dies 12 and bottom chips 30 are substantially eliminated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
    providing a bottom wafer comprising a plurality of bottom semiconductor chips;
    providing a plurality of top dies, each bonded to one of the plurality of bottom semiconductor chips;
    forming an enclosure ring on, and close to an outer parameter of, the bottom wafer;
    applying a protecting material filling spacings between the plurality of top dies, wherein a top surface of the protecting material, top surfaces of the top dies, and a top surface of the enclosure ring are leveled;
    forming a planar dielectric layer on the plurality of top dies and the protecting material; and
    forming a conductive feature in the planar dielectric layer, wherein the conductive feature is electrically connected to at least one of the plurality of top dies and the plurality of bottom semiconductor chips.

2. The method of claim 1 further comprising:
    forming an addition dielectric layer over the dielectric layer; and
    forming a dual damascene conductive structure in the addition dielectric layer and connected to the conductive feature.

3. The method of claim 1, wherein the step of forming the enclosure ring comprises:
    applying a polymer ring; and
    pre-baking the polymer ring before the step of applying the protecting material.

4. The method of claim 1, wherein the step of forming the enclosure ring comprises laminating a dry film as the enclosure ring.

5. The method of claim 1 further comprising, after the steps of forming the enclosure ring and applying the protecting material, performing a planarization to level the top surface of the protecting material, the top surfaces of the top dies, and the top surface of the enclosure ring.

6. The method of claim 5, wherein after the planarization, a through-silicon via (TSV) in the top die is exposed through a top surface of one of the plurality of the top dies, wherein the conductive feature is connected to the TSV.

7. The method of claim 5 further comprising, after the step of planarization, forming a TSV in one of the plurality of top dies, wherein the conductive feature is connected to the TSV.

8. The method of claim 5 further comprising, after the step of planarization, forming a contact plug penetrating the protecting material, wherein the contact plug connects the conductive feature and one of the plurality of bottom semiconductor chips.

9. The method of claim 5 further comprising, before the step of performing the planarization, baking the protecting material and the enclosure ring.

10. The method of claim 1, wherein the step of applying the protecting material comprises stencil printing.

11. The method of claim 1, wherein the step of applying the protecting material comprises screen printing using a mask having openings corresponding to positions of the spacings between the top dies.

12. The method of claim 1, wherein the conductive feature has a top surface leveled with a top surface of the planar dielectric layer.

13. A method of forming an integrated circuit structure, the method comprising:
   providing a bottom wafer comprising a plurality of bottom semiconductor chips;
   bonding a plurality of top dies, each onto one of the plurality of bottom semiconductor chips;
   forming an enclosure ring on, and close to an outer parameter of, the bottom wafer;
   applying a protecting material filling spacings between the plurality of top dies, wherein the protecting material is enclosed by the enclosure ring;
   solidifying the protecting material;
   polishing to planarize the protecting material, the plurality of top dies, and the enclosure ring;
   forming a planar dielectric layer on the plurality of top dies, the protecting material, and the enclosure ring; and
   forming a copper line in the planar dielectric layer, wherein the copper line is electrically connected to at least one of the plurality of top dies and the plurality of bottom semiconductor chips.

14. The method of claim 13, wherein the plurality of top dies and the plurality of bottom semiconductor chips are bonded face-to-face.

15. The method of claim 13, wherein after the polishing, through-silicon vias (TSV) in the plurality of top dies are exposed, and wherein the copper line is connected to one of the TSVs.

16. The method of claim 13 further comprising, after the polishing, forming a TSV in one of the plurality of top dies, wherein the copper line is connected to the TSV.

17. The method of claim 13 further comprising, after the polishing, forming a contact plug penetrating the protecting material, wherein the contact plug connects the copper line and one of the plurality of bottom semiconductor chips.

18. The method of claim 13, wherein the copper line has a top surface leveled with a top surface of the planar dielectric layer.

19. The method of claim 1 wherein after the step of applying a protecting material, a top surface of the protecting material is below top surfaces of the top dies.

20. The method of claim 1 further comprising removing excess protecting material from top surfaces of the top dies after applying the protecting materials.

* * * * *